United States Patent [19]
Nakanishi et al.

[11] Patent Number: 5,227,838
[45] Date of Patent: Jul. 13, 1993

[54] EXPOSURE SYSTEM

[75] Inventors: Yoshito Nakanishi; Takeo Sato; Nobuaki Furuya, all of Kawasaki; Takeo Miyata, Zama; Shinichi Mizuguchi, Osaka, all of Japan

[73] Assignee: Matsushita Electric Industrial Co., Ltd., Osaka, Japan

[21] Appl. No.: 641,944

[22] Filed: Jan. 16, 1991

[30] Foreign Application Priority Data

Jan. 18, 1990 [JP] Japan .................................. 2-8650

[51] Int. Cl.$^5$ .............................................. G03B 27/42
[52] U.S. Cl. ........................................ 355/53; 355/43
[58] Field of Search ................................... 355/53, 43

[56] References Cited

U.S. PATENT DOCUMENTS

| | | |
|---|---|---|
| 3,494,695 | 2/1970 | Sollima et al. ........................ 355/53 |
| 4,669,867 | 6/1987 | Uda et al. ............................. 355/53 |
| 4,699,515 | 10/1987 | Tanimoto et al. . | 
| 4,794,426 | 12/1988 | Nishi .................................... 355/53 |
| 4,812,880 | 3/1989 | Ogawa et al. . |
| 4,843,563 | 6/1989 | Takahashi et al. . |
| 4,884,101 | 11/1989 | Tanimoto ............................. 355/53 |
| 4,958,082 | 9/1990 | Makinouchi ......................... 355/53 |

FOREIGN PATENT DOCUMENTS 60-186845 9/1985 Japan .

OTHER PUBLICATIONS

"Sensor and Locating Technique in Semiconductor Lithography" by Murakami et al; published in 1989.

*Primary Examiner*—Monroe H. Hayes
*Attorney, Agent, or Firm*—Lowe, Price, LeBlanc & Becker

[57] ABSTRACT

An exposure system includes a pulse light source emitting light in response to a trigger signal and giving a predetermined exposure light quantity by a plurality of times of light emission. A reticle has an alignment mark and a light exposure pattern. A projection lens contractedly projects the pattern of the reticle. A wafer has an alignment mark to be located. The wafer is exposed to a projection of the pattern. A wafer stage is movable and carries the wafer. A laser interferometer measures a position of the wafer stage. An alignment device serves to detect a condition of an alignment of the wafer with respect to the reticle in an exposure position.

14 Claims, 4 Drawing Sheets

EXPOSURE SYSTEM

BACKGROUND OF THE INVENTION

1. Field of the Invention

This invention relates to an exposure system for photolithography in fabricating semiconductor devices such as LSIs.

2. Description of the Prior Art

During the fabrication of semiconductor devices such as LSIs, photolithography executes a process of transferring an image from a photographic mask to a resultant pattern on a wafer. Such photolithography is performed by an exposure system. Some exposure systems for photolithography are provided with a mask-to-wafer alignment apparatus.

Japanese published unexamined patent application 60-186845 discloses an exposure system provided with a mask-to-wafer alignment apparatus. In the exposure system of Japanese application 60-186845, a mask has alignment marks and a wafer has corresponding alignment marks. The alignment marks of the mask and the wafer are scanned by laser light, and the laser light scattered and reflected at the alignment marks represents the positional relation between the mask and the wafer. The laser light is analyzed to detect the error in the alignment between the mask and the wafer. The wafer is moved relative to the mask in response to the detected alignment error between the mask and the wafer to obtain a good alignment between the mask and the wafer.

SUMMARY OF THE INVENTION

It is an object of this invention to provide an improved exposure system.

A first aspect of this invention provides an exposure system comprising a pulse light source emitting light in response to a trigger signal and giving a predetermined exposure light quantity by a plurality of times of light emission; a reticle having an alignment mark and a light exposure pattern; a projection lens contractedly projecting the pattern of the reticle; a wafer having an alignment mark to be located, the wafer being exposed to a projection of the pattern; a wafer stage being movable and carrying the wafer; a laser interferometer measuring a position of the wafer stage; and an alignment means for detecting a condition of an alignment of the wafer with respect to an exposure position.

A second aspect of this invention provides an exposure system comprising a reticle having a mask pattern; a wafer; photolithographic means for optically transferring an image of the mask pattern of the reticle onto the wafer; detecting means for detecting an error in a position of the wafer with respect to a predetermined desired position of the wafer; moving means for periodically moving the wafer to periodically nullify the error in the position of the wafer with respect to the predetermined desired position; and control means connected to the photolithographic means and the detecting means for, each time the error detected by the detecting means is nullified, activating the photolithographic means.

A third aspect of this invention provides an exposure system comprising a reticle having a mask pattern; a wafer; photolithographic means for optically transferring an image of the mask pattern of the reticle onto the wafer; detecting means for detecting an error in alignment between the reticle and the wafer; moving means for periodically moving the wafer relative to the reticle to periodically nullify the error in the alignment between the reticle and the wafer; and control means connected to the photolithographic means and the detecting means for, each time the error detected by the detecting means is nullified, activating the photolithographic means.

A fourth aspect of this invention provides an exposure system comprising a reticle having a mask pattern and an alignment mark; a wafer having an alignment mark; photolithographic means for optically transferring an image of the mask pattern of the reticle onto the wafer; detecting means for detecting an error in alignment between the reticle and the wafer by use of the alignment marks of the reticle and the wafer; moving means for periodically moving the wafer relative to the reticle to periodically nullify the error in the alignment between the reticle and the wafer; and control means connected to the photolithographic means and the detecting means for, each time the error detected by the detecting means is nullified, activating the photolithographic means.

DESCRIPTION OF THE FIRST PREFERRED EMBODIMENT

Figure 1:
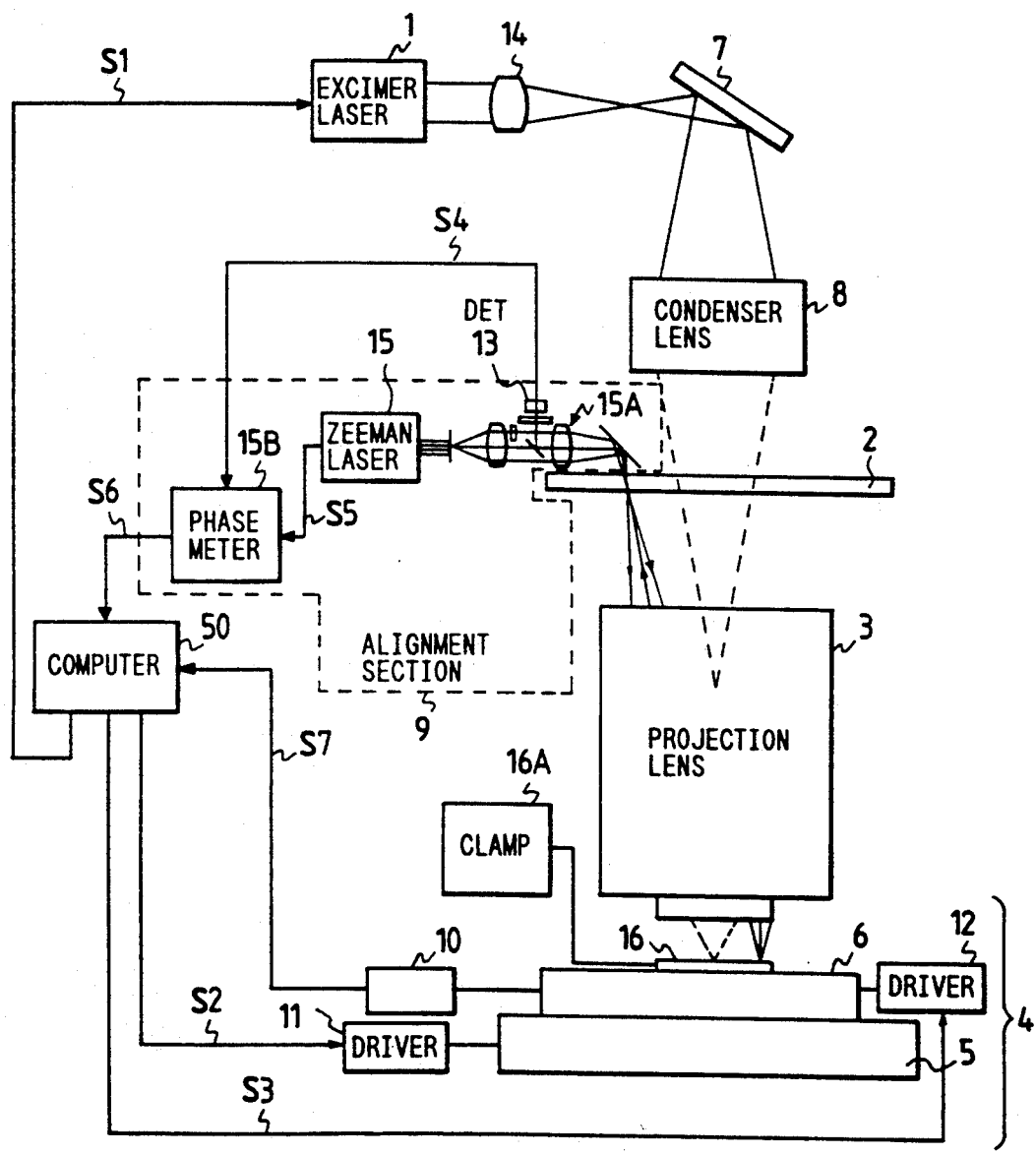
FIG. 1 is a diagram of an exposure system according to an embodiment of this invention.

With reference to FIG. 1, and excimer laser 1 emits a pulse of light, in response to a trigger signal S1, toward an illumination optical system including a condenser optical system 14, a optical-path changing mirror 7, and a condenser lens 8 which are arranged in the order along the direction of travel of the excimer laser light. After the excimer laser light exits from the condenser lens 8, the excimer laser light successively passes through a reticle 2 and a projection lens 3 and then reaches a wafer 16. The reticle 2 is formed with a mask pattern whose image is transferred onto the wafer 16 by photolithography using the excimer laser light. According to a known way, the reticle 2 is located at a predetermined correct position relative to a wafer stage 4 described later.

Figure 2:
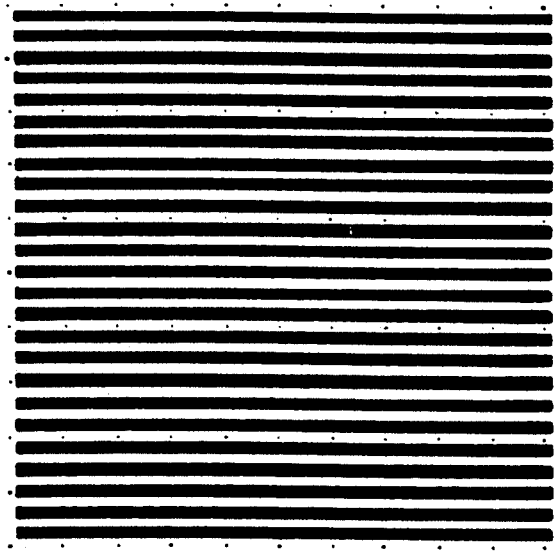
FIG. 2 is a plan view of an alignment mark formed on the reticle and the wafer of FIG. 1.

The reticle 2 and the wafer 16 have alignment marks AM, each of which is composed of a diffraction grating including parallel straight lines as shown in FIG. 2.

The wafer 16 is carried on a wafer stage 4 including a roughly-moving section 5 and a finely-moving section 6. Specifically, the wafer 16 is mounted on the finely-moving section 6, and the finely-moving section 6 is carried on the roughly-moving section 5. The roughly-moving section 5 can be moved by a driver 11 including actuators. The wafer 16 can be horizontally moved through a large stroke in both X and Y directions in accordance with the movement of the roughly-moving section 5. The driver 11 is controlled by a drive signal S2. The finely-moving section 6 can be moved by a drive 12 including actuators. The wafer 16 can be horizontally moved through a small stroke (for example, in the range of several micrometers to several tens of micrometers) in both the X and Y directions in accordance with the movement of the finely-moving section 6. The drive 12 is controlled by a drive signal S3.

A TTL (through the lens) holography alignment section 9 includes a Zeeman laser 15, an optical system 15A, a phase meter 15B, and a photo detector 13. The Zeeman laser 15 continuously emits light toward the optical system 15A. After the Zeeman laser light exits from the optical system 15A, the Zeeman laser light reaches the alignment marks AM of the reticle 2. The Zeeman laser light is diffracted by the alignment marks AM of the reticle 2. Then, a portion of the Zeeman laser light is moved back toward the optical system of the alignment section 15A and another portion of the Zeeman laser light passes through the reticle 2. After the Zeeman laser light passes through the reticle 2, the Zeeman laser light reaches the alignment mark AM of the wafer 16 via the projection lens 3. The Zeeman laser light is diffracted by the alignment marks AM of the wafer 16, and then returns to the optical system 15A via the projection lens 3. As a result of the diffracting effect of the alignment marks AM of the reticle 2 and the wafer 16 on the Zeeman laser light, the Zeeman laser light returning to the optical system 15A has information related to the alignment between the alignment marks AM, that is, the alignment between the reticle 2 and the wafer 16. The returning Zeeman laser light is outputted from the optical system 15A to the photo detector 13. The Zeeman laser light is converted by the photo detector 13 into a corresponding electrical beat signal S4. The beat signal S4 is fed to the phase meter 15B. The Zeeman laser 15 feeds a reference electrical beat signal S5 to the phase meter 15B. The phase meter 15B compares the beat signal S4 and the reference signal S5, generating an alignment signal S6 representing a phase difference corresponding to the error in the alignment between the reticle 2 and the wafer 16.

A mechanical clamp 16A adjustably supports the wafer 16 at three angularly-spaced points. As will be explained later, the mechanical clamp 16A is used for the pre-alignment of the wafer 16.

A laser interferometer 10 detects the position of the finely-moving section 6 of the wafer stage 4, that is, the position of the wafer 16. The laser interferometer 10 outputs a position signal S7 representing the position of the finely-moving section 6 of the wafer stage 4, that is, the position of the wafer 16.

A computer 50 receives the alignment signal S6 from the phase meter 15B, and receives the position signal S7 from the laser interferometer 10. The computer 50 generates the trigger signal S1 and the drive signals S2 and S3 in response to the alignment signal S6 and the position signal S7. The computer 50 outputs the drive signals S2 and S3 to the drives 11 and 12 respectively. As will be described later, the computer 50 moves the roughly-moving section 5 of the wafer stage 4 via the drive signal S2 to shift the wafer 16 into a given allowable positional range, and then the computer 50 vibrates the finely-moving section 6 of the wafer stage 4 via the drive signal S3 and simultaneously monitors the alignment signal S6. During the vibration of the finely-moving section 6 of the wafer stage 4, when the computer 50 detects that the wafer 15 comes into a given good position by referring to the alignment signal S6, the computer 50 feeds the trigger signal S1 to the excimer laser 1. The computer 50 includes a combination of a ROM, a RAM, a CPU, and an input/output circuit. The computer 50 operates in accordance with a control program stored in the ROM.

Figure 3:
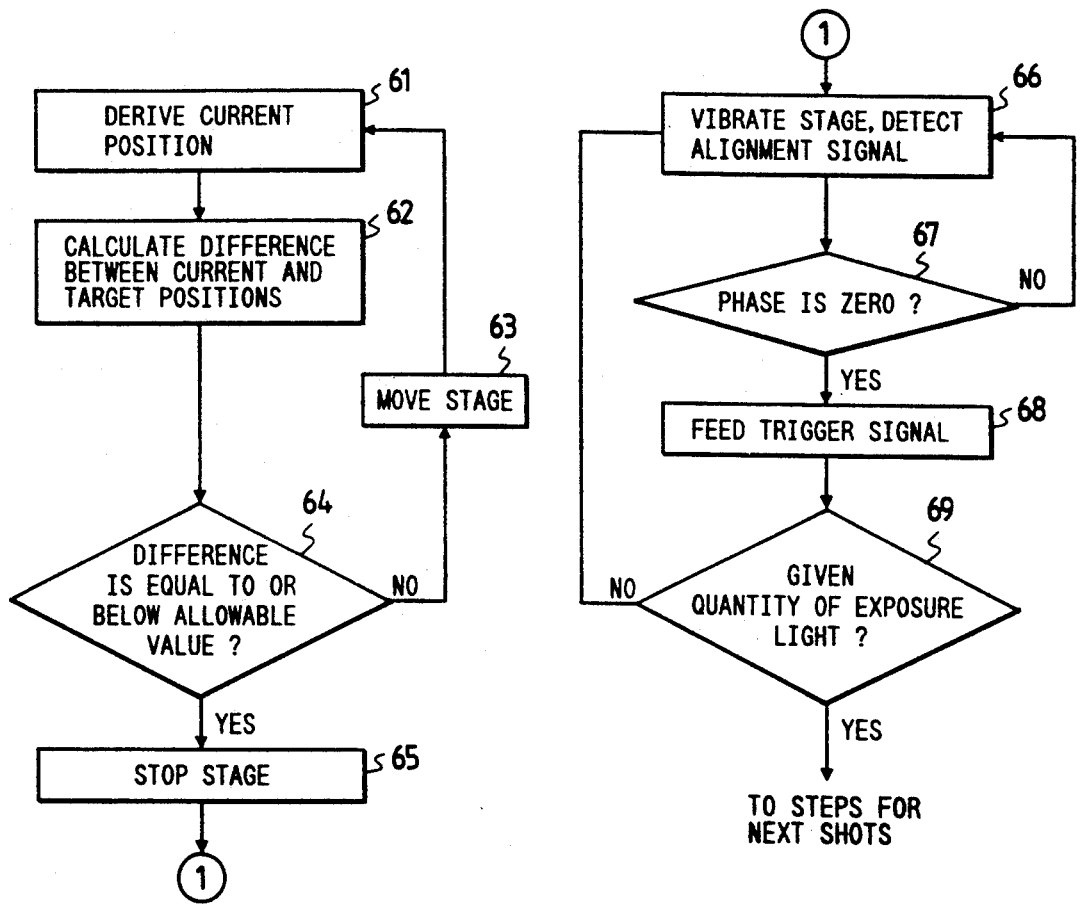
FIG. 3 is a flowchart of a program operating the computer of FIG. 1.

FIG. 3 is a flowchart of a segment of the control program. As shown in FIG. 3, a first step 61 derives the current position of the wafer stage 4 by referring to the position signal S7 outputted from the laser interferometer 10. A step 62 following the step 61 calculates the difference between the current position of the wafer stage 4 and a predetermined target position of the wafer stage 4. A step 64 following the step 62 decides whether or not the calculated difference between the current position and the target position of the wafer stage 4 is smaller than a predetermined allowable value. When the calculated difference is decided to be not smaller than the allowable value, the program advances from the step 64 to a step 63. when the calculated difference is decide to be smaller than the allowable value, the program advances from the step 64 to a step 65. The step 63 controls the drive signal S2 in response to the calculated difference between the current position and the target position of the wafer stage 4 so that the roughly-moving section 5 of the wafer stage 4 will be moved by the driver 11 in a direction of decreasing the difference between the current position and the target position of the wafer stage 4. After the step 63, the program returns to the step 61. Therefore, the steps 61–64 are reiterated until the calculated difference becomes smaller than the allowable value. The step 65 controls the drive signal S2 that the roughly-moving section 5 of wafer stage 4 will be stopped. After the step 65, the program advances to a step 66.

The step 66 activates the drive signal S3 so that the finely-moving section 6 of the wafer stage 4 will be vibrated two-dimensionally in a horizontal plane by the driver 12. The stroke or amplitude of this vibration is equal to a predetermined small value. In addition, the frequency of this vibration is equal to a predetermined frequency, for example, about 200 Hz. For this purpose, the computer 50 includes an oscillator generating a signal having a frequency equal to the frequency of the vibration, and the oscillator signal is used as a base of the drive signal S3. The step 66 derives the current phase difference represented by the alignment signal S6, the phase difference corresponding to the error in the alignment between the reticle 2 and the wafer 16. A step 67 following the step 66 decides whether or not the derived phase difference is null. When the derived phase difference is decided to be not null, the program returns from the step 67 to the step 66. When the derived phase difference is decided to be null, the program advances from the step 67 to a step 68. The step 68 feeds the trigger signal S1 to the excimer laser 1 so that the excimer laser 1 will be activated. As a result of the cooperation by the steps 67 and 68, the excimer laser 1 is activated when a good alignment between the reticle 2 and the wafer 16 is reached. A step 69 following the step 68 decides whether or not the total quantity of the exposure light reaches a reference quantity. The total quantity of the exposure light is detected by, for example, counting the number of times of the activation of the excimer laser 1. When the total quantity of the exposure light does not reach the reference quantity, the program returns from the step 69 to the step 66. As a result, the activation of the excimer laser 1 is reiterated a given number of times in response to the detection of each nullification of the phase difference while the wafer 16 keeps vibrated. When the total quantity of the exposure light reaches the reference quantity so that a present shot of the exposure light is completed, the program advances from the step 69 to next steps for subsequent shots which are similar to the above-mentioned steps.

Before the automatic alignment by the computer 50, the pre-alignment is executed by using the mechanical clamp 16A. During the pre-alignment, the position of the wafer 16 is adjusted by operating the mechanical clamp 16A. The accuracy of the pre-alignment is thus determined by a mechanical factor.

The operation of the computer 50 will now be further described. The computer 50 detects the positions of the alignment marks AM on the wafer 16 by referring to the alignment signal S6 and the position signal S7 outputted from the phase meter 15B and the laser interferometer 10. The computer 50 calculates the differences between the detected positions of the alignment marks AM and pre-registered reference positions of the alignment marks AM. The computer 50 controls the drive signal S2 in response to the calculated differences so that the roughly-moving section 6 will be moved by the driver 11 in a direction of decreasing the calculated differences. As a result, the wafer 16 is roughly aligned with the reticle 2. When the error in the alignment between the wafer 16 and the reticle 2 moves into a predetermined allowable range corresponding to, for example, a quarter of the lattice pitch of the alignment marks AM, the computer 50 activates the drive signal S3 so that the finely-moving section 6 of the wafer stage 4 will be finely vibrated by the driver 12. The wafer 16 vibrates together with the finely-moving section 6 of the wafer stage 4. During the vibration of the wafer 16, the computer 50 monitors the error in the alignment between the wafer 16 and the reticle 2 by referring to the alignment signal S6. The vibration of the wafer 16 is executed two-dimensionally and the stroke (the amplitude) of the vibration of the wafer 16 is set to a given value so that an exact or good alignment between the wafer 16 and the reticle 2 will be periodically reached at different moments during the vibration of the wafer 16. Each time the computer 50 detects a good alignment between the wafer 16 and the reticle 2, the computer 50 feeds the trigger signal S1 to the excimer laser 1, activating the excimer laser 1 and executing a part of a shot of the exposure light. While the wafer 16 keeps vibrated, the activation of the excimer laser 1 is reiterated a given number of times until a shot of the exposure light is completed. For example, 200 times of the activation of the excimer laser 1 completes the transfer of an image of the mask pattern of the reticle 2 onto the wafer 16.

As described previously, the excimer laser 1 emits a pulse of light in response to the trigger signal S1. The light pulse emitted from the excimer laser 1 has a predetermined duration equal to, for example, 20 nanoseconds. The duration of the excimer laser light pulse and the speeds of the vibration of the wafer 16 are chosen so that the wafer 16 can be regarded as being stationary in a position corresponding to a good alignment between the wafer 16 and the reticle 2 during the presence of the excimer laser light pulse. For example, the speed of the vibrational movement of the wafer 16 is set equal to or lower than 10 mm/sec. The duration of the excimer laser light pulse may be equal to or smaller than 10 microseconds.

Figure 4:
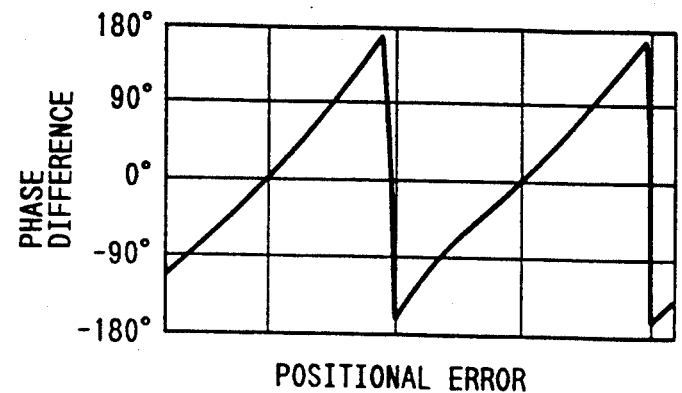
FIG. 4 is a diagram showing the relation between the phase difference and the positional difference in the exposure system of FIG. 1.

The difference in phase between the beat signal S4 and the reference signal S5 outputted from the photo detector 13 and the Zeeman laser 15 varies as a function of the error in the alignment between the wafer 16 and the reticle 2. FIG. 4 shows an example of the relation between the phase difference and the alignment error in one axis. As shown in FIG. 4, the phase difference varies with the alignment error (the positional error) at a period which corresponds to a half of the lattice pitch of the alignment marks AM. At the phase difference being equal to zero, an exact or good alignment between the wafer 16 and the reticle 2 occurs.

Figure 5:
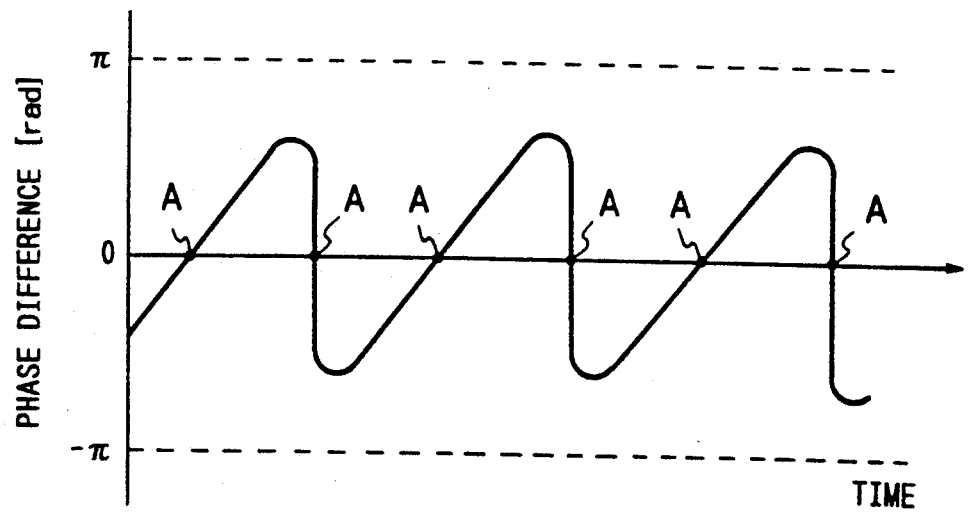
FIG. 5 is a diagram showing a time-domain variation in the phase difference in the exposure system of FIG. 1.

The alignment signal S6 is generated by the phase meter 15B on the basis of the phase difference between the beat signal S4 and the reference signal S5. During the vibration of the wafer 16, as shown in FIG. 5, the phase difference represented by the alignment signal S6 periodically varies and periodically crosses zero at different moments A. At the zero-crossing moments A, an exact or good alignment between the wafer 16 and the reticle 2 occurs. The computer 50 detects the zero-crossing by referring to the alignment signal S6. Upon the detection of each zero-crossing, the computer 50 feeds the trigger signal S1 to the excimer laser 1 to activate the excimer laser 1. Accordingly, each time a good alignment between the wafer 16 and the reticle 2 occurs, the excimer laser 1 is activated.

The above-mentioned embodiment of this invention may be modified as follows. In the modification, the computer 50 predicts the zero-crossing moments A, and feeds the trigger signal S1 to the excimer laser 1 in advance of the actual zero-crossing moments A by a time which is chosen to correspond to the lag (the delay) between the reception of the trigger signal S1 and the emission of the light from the excimer laser 1.

DESCRIPTION OF THE SECOND PREFERRED EMBODIMENT

A second embodiment of this invention is similar to the first embodiment except for design changes indicated hereinafter.

In the second embodiment, the alignment section 9 functions to detect the position of the wafer 16 relative to a predetermined desired position (a predetermined good position) of the wafer 16. In the second embodiment, the alignment marks AM may be omitted from the reticle 2.

In the second embodiment, the Zeeman laser light outputted from the optical system 15A of the alignment section 9 passes through the projection lens 3 and then reaches the wafer 16. The Zeeman laser light is diffracted by the alignment marks AM of the wafer 16, being returned to the optical system 15A of the alignment section 9 via the projection lens 3. The diffracting effect of the alignment marks AM on the Zeeman laser light causes the returned Zeeman light to be provided with information related to the position of the wafer 16. In the alignment section 9, the returned Zeeman light is guided from the optical system 15A to the photo detector 13, being converted by the photo detector 13 into a signal S4 representing the current position of the wafer 16. The reference signal S5 outputted from the Zeeman laser 15 corresponds to the predetermined good position of the wafer 16. The phase meter 15B compares the signals S4 and S5, generating an alignment signal S6 representing the error (the difference) between the current position of the wafer 16 and the predetermined good position of the wafer 16.

In the second embodiment, after the computer 50 roughly locates the wafer 16 by controlling the roughly-moving section 5 of the wafer stage 4, the computer 50 vibrates the wafer 16 by controlling the finely-moving section 6 of the wafer stage 4. During the vibration of the wafer 16, when the computer 50 detects that the current position of the wafer 16 moves into agreement with the predetermined good position of the wafer 16 by referring to the alignment signal S6, the computer 50 feeds the trigger signal S1 to the excimer laser 1 to activate the excimer laser 1.

What is claimed is:

1. An exposure system comprising:
   a reticle having a mask pattern;
   a wafer;
   photolithographic means for optically transferring an image of the mask pattern of the reticle onto the wafer;
   detecting means for detecting an error in a position of the wafer with respect to a predetermined desired position of the wafer;
   moving means for imparting a periodic movement of given amplitude and frequency to the wafer to periodically nullify the error in the position of the wafer with respect to the predetermined desired position; and
   control means connected to the photolithographic means and the detecting means for, each time the error detected by the detecting means is nullified, activating the photolithographic means.

2. An exposure system comprising:
   a reticle having a mask pattern;
   a wafer;
   photolithographic means for optically transferring an image of the mask pattern of the reticle onto the wafer;
   detecting means for detecting an error in alignment between the reticle and the wafer;
   moving means imparting a periodic movement of given amplitude and frequency to the wafer relative to the reticle to periodically nullify the error in the alignment between the reticle and the wafer; and
   control means connected to the photolithographic means and the detecting means for, each time the error detected by the detecting means is nullified, activating the photolithographic means.

3. An exposure system comprising:
   a reticle having a mask pattern and an alignment mark;
   a wafer having an alignment mark;
   photolithographic means for optically transferring an image of the mask pattern of the reticle onto the wafer;
   detecting means for detecting an error in alignment between the reticle and the wafer by use of the alignment marks of the reticle and the wafer;
   moving means for imparting a periodic movement of given amplitude and frequency to the wafer relative to the reticle to periodically nullify the error in the alignment between the reticle and the wafer; and
   control means connected to the photolithographic means and the detecting means for, each time the error detected by the detecting means is nullified, activating the photolithographic means.

4. An exposure system comprising:
   a light source emitting light;
   a reticle located at a give position exposed to the light emitted from the light source, the reticle having a given mask pattern;
   a projection optical system located at a given position exposed to light outputted from the reticle, the projection optical system having a given exposure magnification;
   a wafer exposed to light outputted from the projection optical system, whereby the mask pattern of the reticle is projected onto the wafer;
   moving means for imparting a periodic movement of given amplitude and frequency to, at least the wafer in a manner such that the wafer passes through a given reference position or a region near the given reference position; and
   controlling means for controlling the light in a manner such that the mask pattern of the reticle is projected onto the wafer by the light when the wafer passes through the given reference position or the region near the given reference position.

5. The exposure system of claim 4, further comprising detecting means for detecting an error of a position of the wafer with respect to the given reference position, and wherein the controlling means comprises means for, when the position error detected by the detecting means is substantially zero, recognizing that the wafer passes through the given reference position or the region near the given reference position and controlling the light source and thereby controlling the light in a manner such that the mask pattern of the reticle is projected onto the wafer by the light.

6. The exposure system of claim 4, wherein the moving means comprises moving means for imparting said periodic movement in a plane parallel to the wafer.

7. The exposure system of claim 4, wherein the light projects the mask pattern of the reticle onto the wafer in a time short with respect to a speed of movement of the wafer by the moving means.

8. The exposure system of claim 4, wherein the given reference position agrees with a position at which the wafer and the reticle are in positional alignment via the projection optical system.

9. An exposure system comprising:
   a light source emitting light;
   a reticle located at a given position exposed to the light emitted from the light source, the reticle having a given mask pattern;
   a projection optical system located at a given position exposed to light outputted from the reticle, the projection optical system having a given exposure magnification;
   a wafer exposed to light outputted from the projection optical system, whereby the mask pattern of the reticle is projected onto the wafer;
   moving means for imparting a periodic movement of given amplitude and frequency to at least the wafer in a manner such that the wafer passes through a given reference position or a region near the given reference position, the given reference position agreeing with a position at which the wafer and the reticle are in positional alignment; and
   controlling means for controlling the light in a manner such that the mask pattern of the reticle is projected onto the wafer by the light when the wafer passes through the given reference position or the region near the given reference position.

10. The exposure system of claim 9, further comprising detecting means for detecting an error of a position of the wafer with respect to the given reference position, and wherein the controlling means comprises means for, when the position error detected by the detecting means is substantially zero, recognizing that the wafer passes through the given reference position or the region near the given reference position and controlling the light source and thereby controlling the light in a manner such that the mask pattern of the reticle is projected onto the wafer by the light.

11. The exposure system of claim 9, wherein the moving means comprises moving means for imparting said periodic movement in a plane parallel to the wafer.

12. The exposure system of claim 9, wherein the light projects the mask pattern of the reticle onto the wafer in a time short with respect to a speed of movement of the wafer by the moving means.

13. An exposure system comprising:
 a light source emitting light;
 a reticle located at a given position exposed to the light emitted from the light source, the reticle having a given mask pattern;
 a projection optical system located at a given position exposed to light outputted from the reticle, the projection optical system having a given exposure magnification;
 a wafer exposed to light outputted from the projection optical system, whereby the mask pattern of the reticle is projected onto the wafer;
 moving means for imparting a periodic movement of given amplitude and frequency to at least the wafer in a manner such that the wafer passes through a given reference position or a region near the given reference position; and
 controlling means for controlling the light source and thereby controlling the light in a manner such that the mask pattern of the reticle is projected onto the wafer by the light at a given time prior to a moment at which the wafer passes through the given reference position or the region near the given reference position;
 wherein the given time is substantially equal to a time spent in the control of the light source by the controlling means.

14. An exposure system comprising:
 a light source emitting light;
 a reticle located at a given position exposed to the light emitted from the light source, the reticle having a given mask pattern;
 a projection optical system located at a given position exposed to light outputted from the reticle, the projection optical system having a given exposure magnification;
 a wafer exposed to light outputted from the projection optical system, whereby the mask pattern of the reticle is projected onto the wafer;
 moving meaNs for imparting a periodic movement of given amplitude and frequency to at least the wafer in a manner such that the wafer passes through a given reference position or a region near the given reference position, the given reference position agreeing with a position at which the wafer and the reticle are in positional alignment; and
 controlling means for controlling the light source and thereby controlling the light in a manner such that the mask pattern of the reticle is projected onto the wafer by the light when the wafer passes through the given reference position or the region near the given reference position;
 wherein the given time is substantially equal to a time spent in the control of the light source by the controlling means.

* * * * *